(12) United States Patent
Hu

(10) Patent No.: US 8,832,988 B2
(45) Date of Patent: Sep. 16, 2014

(54) TRANSMISSION-TYPE OLED RIFLESCOPE

(75) Inventor: Liangbin Hu, Chongqing (CN)

(73) Assignee: Chongqing Aite Optical and Electronics Co., Ltd., Chongqing (CN)

( * ) Notice: Subject to any disclaimer, the term of this patent is extended or adjusted under 35 U.S.C. 154(b) by 0 days.

(21) Appl. No.: 13/820,771

(22) PCT Filed: Jun. 15, 2012

(86) PCT No.: PCT/CN2012/076964
§ 371 (c)(1),
(2), (4) Date: Jul. 18, 2013

(87) PCT Pub. No.: WO2013/000363
PCT Pub. Date: Jan. 3, 2013

(65) Prior Publication Data
US 2013/0283662 A1   Oct. 31, 2013

(30) Foreign Application Priority Data

Jun. 30, 2011 (CN) .......................... 2011 1 0179481

(51) Int. Cl.
| | |
|---|---|
| *F41G 1/473* | (2006.01) |
| *F41G 1/35* | (2006.01) |
| *F41G 1/38* | (2006.01) |
| *F41G 3/06* | (2006.01) |
| *H01L 51/52* | (2006.01) |
| *H01L 27/32* | (2006.01) |

(52) U.S. Cl.
CPC .. *F41G 1/35* (2013.01); *F41G 1/38* (2013.01); *F41G 1/473* (2013.01); *F41G 3/065* (2013.01); *H01L 51/5237* (2013.01); *H01L 27/32* (2013.01); *H01L 2251/5323* (2013.01)
USPC .................. 42/114; 42/119; 42/142; 359/431

(58) Field of Classification Search
CPC .............. F41G 1/38; F41G 1/473; F41G 1/52
USPC .................. 42/119, 120, 122, 123, 142, 114; 359/400, 431
See application file for complete search history.

(56) References Cited

U.S. PATENT DOCUMENTS

| | | | |
|---|---|---|---|
| 6,061,945 A | 5/2000 | Wallace et al. | |
| 6,778,324 B1 * | 8/2004 | Kato | ............................. 359/431 |
| 7,505,120 B2 * | 3/2009 | Ing-Song et al. | ............. 356/5.02 |
| 7,944,611 B1 | 5/2011 | Regan et al. | |
| 2005/0219690 A1 | 10/2005 | Lin et al. | |

FOREIGN PATENT DOCUMENTS

| | | |
|---|---|---|
| CN | 101997088 A | 3/2011 |
| CN | 102062564 A | 5/2011 |
| CN | 201885637 U | 6/2011 |

(Continued)

OTHER PUBLICATIONS

International Search Report issued in PCT/CN2012/076964, Sep. 27, 2012.

*Primary Examiner* — Stephen M Johnson

(74) *Attorney, Agent, or Firm* — Workman Nydegger

(57) ABSTRACT

A transmission-type OLED riflescope with a prism assembly having an ocular lens and an objective lens, wherein the prism assembly has a roof prism, a half pentaprism, an isosceles prism and a spectro-film, and the right end of a laser receiver abuts against the left end of the isosceles prism so that both of the laser receiver and the isosceles prism are located below the axis of the lens cone while the laser transmitter is located above the axis of the lens cone with the laser transmitted from the laser transmitter exiting after being refracted by the objective lens, while a transmission-type OLED display is arranged between the ocular lens and the prism assembly. Functions of the riflescope include observing, aiming, and laser ranging and transmission using the same objective lens. The viewer can also see the objects behind the lens.

2 Claims, 3 Drawing Sheets

(56) References Cited

FOREIGN PATENT DOCUMENTS

| CN | 102252563 A | 11/2011 |
| CN | 202149722 U | 2/2012 |
| CN | 202150458 U | 2/2012 |
| GB | 2 428 929 A * | 2/2007 |

* cited by examiner

TRANSMISSION-TYPE OLED RIFLESCOPE

TECHNICAL FIELD

The invention relates to an optical aiming device, more specifically to a transmission-type OLED optical sighting telescope, which is especially suitable for being mounted on all kinds of guns to improve the accuracy of shooting.

TECHNICAL BACKGROUND

An OLED display, or an organic light emitting diode display, can display images through generating light emission from luminescent materials driven by electrical current. Compared with a traditional LCD display, the OLED display is self-luminous while the LCD display illuminates through a backlight and thus requires an illuminating light source mounted behind the liquid crystal, so that OLED display possesses higher brightness, larger contrast ratio and better color effect than LCD display. In addition, the OLED display, which is free from the limitation of the angle of view, has an angle of view generally up to 160°, thus enabling observations without distortion even from the side. Moreover, the LCD display requires a backlight for illumination, while the OLED display only requires electricity applied to the matrix to be illuminated, which results in lower voltage and less power consumption. Compared with the LCD display, the OLED display is lighter in weight, and can be manufactured with less material through a simple process. In mass production, the cost of OLED displays is 20% lower than that of LCD displays. Besides, the OLED display also possesses properties such as flexibility, vibration resistance and so on, and has been considered as the most promising display for the next generation in the field. However, current OLED displays are only utilized in the fields of mobile phones and televisions, wherein the viewer can only see various images shown by the electrified OLED luminescent materials, but the objects behind the display are completely invisible and are not necessarily being visible. Such kind of OLED displays are not provided with the function of transmission observation.

Sighting telescopes with a magnifying function which has been widely used so far are capable of distinguishing and identifying remote targets, and thus they are suitable for accurate shooting at long-distance targets. It basically consists of an objective lens, an inverted lens and an ocular lens, together with a reticle. An aiming mark is arranged on the reticle, and targets at different distances are sighted by moving the reticle or using scales at different locations. With the development of optical aiming technology, some sighting telescopes are further provided with laser ranging means, which requires two objective lenses in structure, one for transmitting and receiving laser and the other for observing the target. Therefore, the manufacturing cost is increased while the integral structure is incompact.

As a result, traditional sighting telescopes with a reticle are not capable of meeting the requirements of operations at the information age. It would importantly influence the development of riflescopes if an OLED display could be introduced into the field of riflescopes and provided with the function of transmission so that remote targets could be observed through the display, and the laser transmission and receiving and the targets observation can be achieved with one same objective lens.

SUMMARY OF THE INVENTION

The object of the invention is to provide a riflescope with the functions of observing, aiming and laser ranging, wherein the laser transmission and receiving and the objects observation are achieved with one same object lens. With the advanced OLED displaying technology applied to the riflescopes and the function of transmission provided, the viewer can not only see various images shown by the electrified OLED luminescent materials, but also the objects behind through the OLED display. The riflescope is especially suitable for observation devices integrated with the functions of observation, aiming and data display.

Aiming at solving the technical problems described above, the present invention adopts the following technical solutions, i.e., a transmission-type OLED riflescope consisting of a lens cone (1), an objective lens (2), an ocular lens (3), and a prism assembly (4) arranged between the ocular lens (3) and the objective lens (2). One of the key points of the present invention is that the prism assembly (4) consists of a roof prism (41), a half pentaprism (42), an isosceles prism (43) and a spectro-film (44), with the spectro-film (44) arranged between the half pentaprism (42) and the isosceles prism (43). A laser transmitter (5) and a laser receiver (6) are arranged between the objective lens (2) and the prism assembly (4), with the right end of the laser receiver (6) abutting against the left end of the isosceles prism (43) so that both of the laser receiver (6) and the isosceles prism (43) are located below the axis of the lens cone (1). The laser transmitter (5) is located above the axis of said lens cone (1) and the laser transmitted from the laser transmitter (5) exits after being refracted by the objective lens (2). A transmission-type OLED display (7) is arranged between the ocular lens (3) and the prism assembly (4), and includes a front substrate (71), a back substrate (72), an electrically-conductive high transparent resin (73) arranged in the form of matrix, an IC chip (74) and a metallic connecting band (75). The electrically-conductive high transparent resin (73) is encapsulated between the front substrate (71) and the back substrate (72), wherein the front substrate (71) and the back substrate (72) are both transparent glass panels and the light transmittance of the electrically-conductive high transparent resin (73) is at least 75%.

Desiccating agent (76) is further encapsulated between the front substrate (71) and the back substrate (72) of the transmission-type OLED display (7) and arranged symmetrically at the left side and the right side of the electrically-conductive high transparent resin (73) to prolong the service life of the OLED display.

In the present invention, the electrically-conductive high transparent resin is controlled by the IC chip. When different matrix units in the electrically-conductive high transparent resin arranged in the form of matrix are electrified to emit light, various images are shown. The OLED display is capable of self-emitting light with high brightness, and therefore being especially suitable for use during night. The front substrate and the back substrate are both transparent glass panels with high light transmittance, so that the viewer can not only see the pictures shown by the electrified luminescent materials themselves, but also the objects behind through the OLED display. The entire OLED display is provided with light transmission function, which is novel in the OLED display technology. The OLED display is a new type of display designed especially for observation instruments integrated with the functions of observation, aiming and data display, which enables the application of the OLED display technology to expand from the fields of mobile phones and televisions to the field of sighting telescopes. Furthermore, the riflescope, having a reasonable arrangement and a compact structure, is provided with the functions of observing, aiming and laser ranging, and the laser transmission and receiving and the objects observation are implemented with one same objective lens, thus decreasing the manufacturing cost and bringing vast application prospects.

DETAILED DESCRIPTION OF EMBODIMENTS

Now the present invention will be further discussed with reference to the accompanying drawings and examples.

Figure 1:
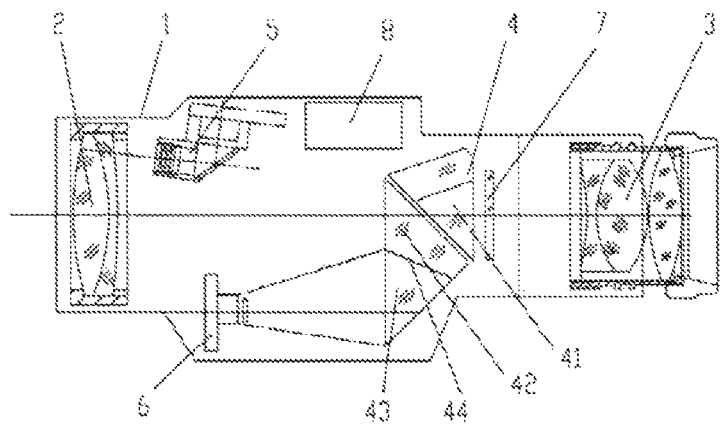
FIG. 1 schematically shows the structure of the riflescope of the present invention.

As shown in FIG. 1, the riflescope comprises a lens cone 1, and an ocular lens 3, an objective lens 2, a prism assembly 4, a laser transmitter 5, a laser receiver 6, a transmission-type OLED display 7, a battery 8 and a plurality of circuit boards mounted in the lens cone 1. The ocular lens 3 is located at the back of the objective lens 2, and the prism assembly 4 is arranged between the ocular lens 3 and the objective lens 2. The prism assembly 4 consists of a roof prism 41, a half pentaprism 42, an isosceles prism 43 and a spectro-film 44, with the spectro-film 44 arranged between the half pentaprism 42 and the isosceles prism 43. The laser transmitter 5 and the laser receiver 6 are arranged between the objective lens 2 and the prism assembly 4. The right end of the laser receiver 6 abuts against the left end of the isosceles prism 43, and both of the laser receiver 6 and the isosceles prism 43 are located below the axis of the lens cone 1, while the laser transmitter 5 is located above the axis of the lens cone 1, with the laser transmitted from the laser transmitter 5 exiting after being refracted by the objective lens 2. The transmission-type OLED display 7 is arranged between the ocular lens 3 and the prism assembly 4, and the battery 8, which is mounted in the lens cone 1, is connected with the laser transmitter 5, the laser receiver 6 and the transmission-type OLED display 7 through wires.

Figure 2:
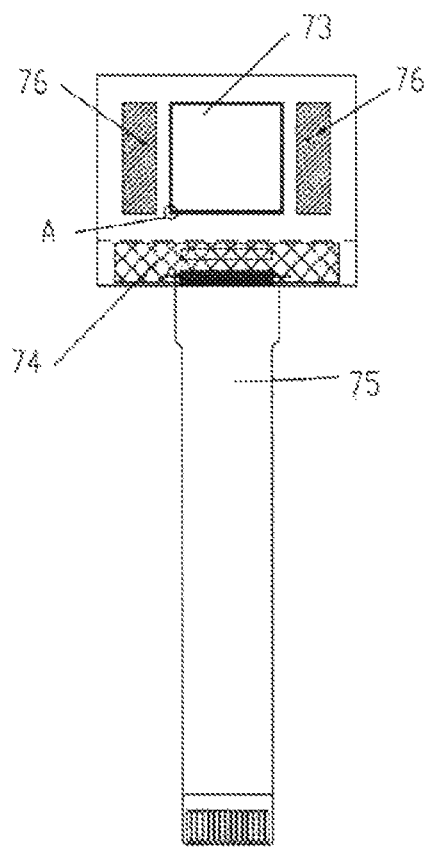
FIG. 2 schematically shows the structure of the transmission-type OLED display of the present invention.

As shown in FIG. 2, the transmission-type OLED display 7 comprises a front substrate 71, a back substrate 72, an electrically conductive high transparent resin 73, an IC chip 74, a metallic connecting band 75 and the like.

Figure 3:
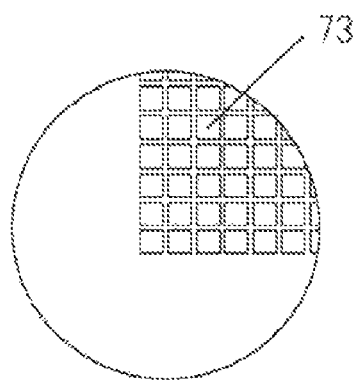
FIG. 3 is an enlarged view of area A in FIG. 2.

With reference to FIG. 3, the electrically conductive high transparent resin 73 is arranged in the form of a matrix with N×N units, each unit of the matrix constituting a display unit of the OLED display. The material of the electrically conductive high transparent resin is of a composite layer structure, the constitution of which is identical with common electrically conductive transparent resin materials, including luminescent materials such as trisaluminum-8-hydroxyquinoline, fluorescent dye lamp and the like. However, the light transmittance of the electrically conductive high transparent resin is much higher than that of common transparent resin materials, having a light transmittance of at least 75%.

Figure 4:
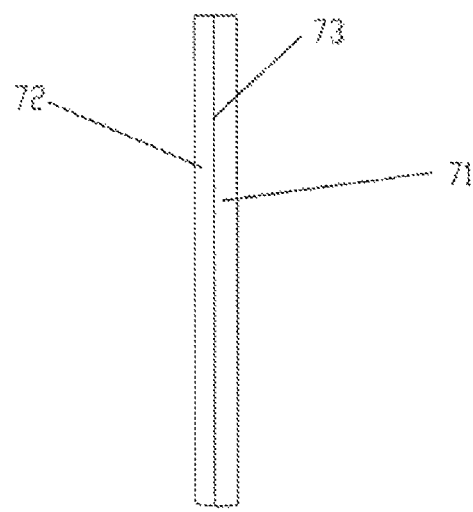
FIG. 4 shows the locations of the front substrate, the back substrate and the electrically conductive high transparent resin of the transmission-type OLED display.

As shown in FIG. 4, the electrically conductive high transparent resin 73 is encapsulated between the front substrate 71 and the back substrate 72, wherein the front substrate 71 and the back substrate 72 are both transparent glass panels.

Preferably, as shown in FIG. 2, two bar-shaped elements of the desiccating agent 76 are also encapsulated between the front substrate 71 and the back substrate 72 and arranged symmetrically at the left side and the right side of the electrically conductive high transparent resin 73.

Figure 5:
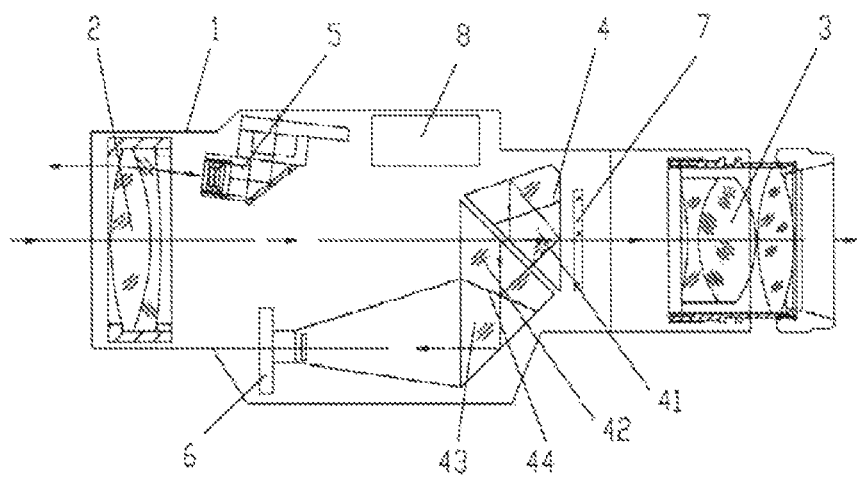
FIG. 5 shows the refractive light path in the present invention.

As shown in FIG. 5, laser from the laser transmitter 5 impacts on the object to be observed after being refracted by the objective lens 2, and returns back to the half pentaprism 42 of the prism assembly 4 after being reflected by the object observed. The laser refracted by the half pentaprism 42 reaches the spectro-film 44, wherein the visible part of the light is refracted to the roof prism 41 by the spectro-film 44 and the invisible part of the light passes through the spectro-film 44 and enters into the laser receiver 6 after being refracted by the isosceles prism 43. The data received by the laser receiver are sent to the transmission-type OLED display through electric circuits, so that the viewer can see images and data shown by the transmission-type OLED display itself, as well as the object behind through the transmission-type OLED display due to the high light transmittance thereof.

The invention claimed is:

1. A transmission-type OLED riflescope, comprising a lens cone, an objective lens, an ocular lens, a prism assembly being arranged between the ocular lens and the objective lens, wherein said prism assembly consists of a roof prism, a half pentaprism, an isosceles prism and a spectro-film, with said spectro-film arranged between the half pentaprism and the isosceles prism, a laser transmitter and a laser receiver are arranged between the objective lens and the prism assembly, with the right end of said laser receiver abutting against the left end of the isosceles prism, and both of the laser receiver and the isosceles prism are located below the axis of the lens cone, and said laser transmitter is located above the axis of said lens cone so that the laser transmitted from the laser transmitter exits after being refracted by the objective lens, a transmission-type OLED display is arranged between said ocular lens and the prism assembly, and includes a front substrate, a back substrate, an electrically conductive high transparent resin arranged in the form of a matrix, an IC chip and a metallic connecting band, with said electrically conductive high transparent resin encapsulated between the front substrate and the back substrate, wherein said front substrate and back substrate are both transparent glass panels, and the light transmittance of said electrically conductive high transparent resin is at least 75%.

2. A transmission-type OLED riflescope according to claim 1, wherein, the desiccating agent is further encapsulated between the front substrate and the back substrate of said transmission-type OLED display, with said desiccating agent arranged symmetrically at the left side and the right side of the electrically conductive high transparent resin.

* * * * *